(12) United States Patent
Wang et al.

(10) Patent No.: US 10,433,459 B2
(45) Date of Patent: Oct. 1, 2019

(54) DATA CENTRE CABINET AND GRAVITY SPRAY SYSTEM THEREOF

(71) Applicant: Guangdong HI-1 New Materials Technology Research Institute Co., Ltd, Guangzhou (CN)

(72) Inventors: Wei Wang, Guangzhou (CN); Wei Xiao, Guangzhou (CN); Changlei Ren, Guangzhou (CN)

(73) Assignee: GUANGDONG HI-1 NEW MATERIALS TECHNOLOGY RESEARCH INSTITUTE CO., LTD, Guangzhou (CN)

( * ) Notice: Subject to any disclaimer, the term of this patent is extended or adjusted under 35 U.S.C. 154(b) by 0 days.

(21) Appl. No.: 16/120,181

(22) Filed: Aug. 31, 2018

(65) Prior Publication Data

US 2018/0368281 A1 Dec. 20, 2018

Related U.S. Application Data

(63) Continuation of application No. PCT/CN2017/074961, filed on Feb. 27, 2017.

(30) Foreign Application Priority Data

Jan. 20, 2017 (CN) .......................... 2017 1 0049996

(51) Int. Cl.
*H05K 7/20* (2006.01)
*H01L 23/473* (2006.01)
*H05K 7/14* (2006.01)

(52) U.S. Cl.
CPC ..... *H05K 7/20272* (2013.01); *H01L 23/4735* (2013.01); *H05K 7/1489* (2013.01); *H05K 7/20772* (2013.01); *H05K 7/20781* (2013.01)

(58) Field of Classification Search
CPC ............ H01L 23/4735; H05K 7/20272; H05K 7/20327; H05K 7/20345; H05K 7/20763–20781
See application file for complete search history.

(56) References Cited

U.S. PATENT DOCUMENTS

| | | | | |
|---|---|---|---|---|
| 5,220,804 A | * | 6/1993 | Tilton | ....................... B64G 1/50 257/E23.088 |
| 6,958,911 B2 | * | 10/2005 | Cader | ................ H05K 7/20345 165/104.33 |

(Continued)

FOREIGN PATENT DOCUMENTS

| CN | 102037426 A | 4/2011 |
|---|---|---|
| CN | 105025691 A | 11/2015 |
| CN | 105652993 A | 6/2016 |

*Primary Examiner* — Robert J Hoffberg

(57) ABSTRACT

A data center cabinet includes a cabinet body, an oil distributor and a plurality of liquid distributors. The cabinet body is sequentially mounted with a plurality of server housings from high to low. A liquid distributor is provided above each of the plurality of server housings. The present invention also relates to a gravity spray system. On the one hand, as cooling liquid oil is concentrated in an oil distributor tank disposed above, the oil automatically flows along an oil passage under gravity, and there is no need to provide pressure in the oil passage, thus reducing the power consumption of an oil pump, improving the coefficient of performance (COP) of a heat dissipation system and reducing the overall PUE of a data center. An oil quantity regulator in an oil distribution unit is used to ensure consistent flow rate distributed to each layer of server.

51 Claims, 9 Drawing Sheets

(56) References Cited

U.S. PATENT DOCUMENTS

| | | | |
|---|---|---|---|
| 7,042,726 B2* | 5/2006 | Cader | H05K 7/20345 |
| | | | 165/80.4 |
| 7,318,322 B2* | 1/2008 | Ota | H05K 7/20781 |
| | | | 62/259.2 |
| 2004/0008483 A1* | 1/2004 | Cheon | G06F 1/20 |
| | | | 361/679.53 |
| 2007/0193300 A1* | 8/2007 | Tilton | F25B 43/04 |
| | | | 62/475 |
| 2007/0193721 A1* | 8/2007 | Tilton | F25B 43/04 |
| | | | 165/104.19 |
| 2011/0013359 A1 | 1/2011 | Goldrian et al. | |
| 2011/0026225 A1 | 2/2011 | Ostwald et al. | |
| 2014/0124174 A1 | 5/2014 | Campbell et al. | |
| 2015/0237767 A1 | 8/2015 | Shedd et al. | |
| 2018/0368282 A1* | 12/2018 | Wang | H05K 7/20772 |
| 2019/0132997 A1* | 5/2019 | Wang | H05K 7/20 |

\* cited by examiner

DATA CENTRE CABINET AND GRAVITY SPRAY SYSTEM THEREOF

CROSS-REFERENCE TO RELATED APPLICATIONS

This non-provisional patent application is a continuation application of International Application No. PCT/CN2017/074961, filed on Feb. 27, 2017, which is based upon and claims priority to Chinese Patent Application No. 201710049996.9, filed on Jan. 20, 2017, the entire contents of which are incorporated herein by reference.

TECHNICAL FIELD

The present invention relates to cooling equipment of a large server, in particular to a data centre cabinet and a gravity spray system thereof.

BACKGROUND

Driven by the big data service and market, all kinds of servers, blade servers, etc. used in the data centre have significantly increased power and higher and higher arrangement density. Correspondingly, the heat dissipation problem under high heat flux has attracted much attention, which has also become the focus and technical bottleneck of data centre construction and the operation and maintenance work thereof. An indirect or direct liquid cooling mode is considered as the inevitable trend of heat dissipation for the data centre due to its high comprehensive heat exchange efficiency. In particular, in view of the advantages of direct heat-source contact for heat absorption, a high comprehensive heat exchange coefficient of liquid cooling and very small heat transfer resistance, a direct liquid cooling mode is theoretically the most effective way to dissipate heat.

Most of the traditional cabinets use air cooling methods for heat dissipation, and the cooling capacity is limited. If the density of equipment in the cabinet increases, the internal temperature of the equipment will rise sharply and cannot be effectively cooled. In addition, the traditional cabinet is of an open structure, with a low ingress protection (IP) level, local turbulence and heat dissipation dead corners, resulting in a low heat dissipation efficiency and high energy consumption.

The existing technology is immature. In engineering application practice, one of the key links of liquid cooling is the liquid supply system. How to improve the liquid supply efficiency while reducing the energy consumption of the supply circulation system is the key to solve the problem in engineering application. On the one hand, to maintain normal operation of the heat dissipation system, the liquid supply system needs to be equipped with a liquid pump to provide pump work and backup pressure. In the heat dissipation system, the pump structure and pump consumption will occupy a large part of the hardware configuration and software control of the system. If the pump usage can be reduced, especially the use of a high-pressure pump, the comprehensive energy efficiency of such heat dissipation system will be greatly improved, and the engineering costs and operation and maintenance costs will be reduced at the same time. If the power consumption of the pump is too high during this process, the total power consumption of the heat dissipation system will be increased, thus reducing the coefficient of performance (COP) of the heat dissipation system and increasing the overall PUE of the data centre, and reducing the energy saving and environmental protection effects. On the other hand, the servers in the cabinet are usually stacked from top to bottom. If there exists different degrees of pressure loss in the process of supplying circulating fluid to each layer of server by a liquid supply interface, the heat dissipation effect of each layer of server will be seriously affected due to different liquid supply amount, different heat dissipation temperature and different heat dissipation efficiency.

SUMMARY

The purpose of the present invention is to overcome the above problems existing in the prior art and provides a data centre cabinet and a gravity spray system thereof, thus improving the coefficient of performance (COP) of a heat dissipation system and reducing the overall PUE of a data centre.

In order to realize the above-mentioned technical purpose and achieve the above-mentioned technical effect, the present invention is realized by the following technical solutions:

a data centre cabinet, comprising a cabinet body, an oil distributor and a plurality of liquid distributors, wherein the cabinet body comprises a plurality of mounting racks; the cabinet body is sequentially mounted with a plurality of server housings from high to low; a server is placed in the server housing; one of the liquid distributors is provided above each of the server housings; the oil distributor is mounted above all the liquid distributors; the oil distributor is connected to the liquid distributors via an oil intake device; and cooling liquid oil is distributed and flows to the liquid distributors through the oil distributor, and the liquid distributors spray the cooling liquid oil to the server for cooling.

Further, the oil distributor comprises a case, at least one oil distribution inlet end and a plurality of oil distribution units; the plurality of oil distribution units are mounted in the case; the oil distribution unit comprises an oil distribution outlet end; and cooling liquid oil enters the oil distributor from the oil distribution inlet end, and is connected to the liquid distributor via the oil distribution outlet end.

Further, the oil distribution unit further comprises a vent pipe, an oil quantity regulator and a diversion guide plate; the oil quantity regulator is directly opposite the oil distribution outlet end, and the oil quantity regulator controls the oil quantity discharged at the oil distribution outlet end; the diversion guide plate separates each of the oil distribution units into an independent unit; the vent pipe is in communication with the oil distribution outlet end; the oil quantity regulator comprises a cone, an elastic member and a pressing rod; the pressing rod is fixedly mounted on one side of the case; the cone is fixed at a lower end of the pressing rod; the cone is directly opposite the oil distribution outlet end; and the elastic member adjusts the distance between the cone and the oil distribution outlet end.

Further, the oil distributor further comprises an oil intake regulating valve, a bubble removing device, a pressure relief pipe and a respirator; the oil intake regulating valve is connected to the oil distribution inlet end via a pipeline; the oil intake regulating valve comprises an oil intake valve body, a connecting rod and a floating body; the floating body ascends and drives the connecting rod to move, so as to close the oil intake valve body; the bubble removing device is mounted adjacent to the oil distribution unit; the pressure relief pipe comprises at least one pressure relief oil inlet, at least one pressure relief oil outlet and a plurality of pressure relief holes; the pressure relief oil inlet is connected to the oil intake regulating valve; the plurality of pressure relief holes are located on a pipe wall of the pressure relief pipe; the respirator is mounted on an upper cover of the case; and the respirator is used for allowing the air inside the oil distributor to be in communication with the outside air.

Further, the liquid distributor comprises an oil return chamber, an oil spray chamber, a liquid distribution oil inlet and an oil return port; the oil return chamber is positioned above the oil spray chamber; the liquid distribution oil inlet is positioned in the oil spray chamber; a lower bottom face of the oil spray chamber is provided with a spray hole; the spray hole is directly opposite the server; the oil return chamber receives the cooling liquid oil flowing through the server above the liquid distributor; and the oil return port is used for discharging the cooling liquid oil in the oil return chamber.

Further, the liquid distributor further comprises an overflow hole; the overflow hole is provided on the lower bottom face of the oil spray chamber; the overflow hole is higher than the lower bottom face of the oil spray chamber; and the oil return chamber is at an included angle to the horizontal plane.

Further, the server housing comprises an upper cover and a box; the upper cover is fixed on the box; the upper cover comprises a coolant intake pipe, at least one spray pressure chamber, at least one spray hole and an upper cover shell, and the box comprises a box shell and a coolant outlet pipe; an inner surface of the upper cover shell is provided with the spray pressure chamber, the coolant intake pipe is connected to the spray pressure chamber, and each spray pressure chamber is provided with the spray hole; and the spray hole is directly opposite a heating chip area of the server.

Further, the box is internally provided with a flow channel, and the coolant outlet pipe is in communication with the flow channel; the server housing further comprises a seal, and the upper cover is hermetically installed with the box through the seal; the inner surface of the box shell is further provided with a partition; and the flow channel and the heating chip area of the server are located on the same side of the partition.

Further, the data centre cabinet further comprises an oil intake switch valve; the oil intake switch valve is installed at the joint between the server housing and the oil intake device and the joint between the liquid distributor and the oil intake device; the oil intake switch valve comprises a switch valve oil inlet, a valve core, a valve body, a switch and a telescopic oil outlet; the switch valve oil inlet is connected to the oil intake device; and the switch controls the valve core and the telescopic oil outlet.

In another aspect, the present invention provides a gravity spray system which comprises a main oil tank, a pump, a radiator, a data centre cabinet described above, an oil intake device, an oil return device and cooling liquid oil. The main oil tank, the pump, the radiator and the data centre cabinet are connected into a closed oil circuit by the oil intake device and the oil return device. The cooling liquid oil is pumped out of the main oil tank by the pump, and then, after passing through the radiator for heat exchange, enters the oil distributor in the data centre cabinet through a pipeline. The oil distributor is located at an upper part of the data centre cabinet; the oil distributor distributes oil, and the liquid distributor distributes and sprays liquid to cool the server; and the cooling liquid oil after the cooling treatment returns to the main oil tank through the oil return device.

Further, the gravity spray system further comprises a filter and an auxiliary oil tank; the filter is connected in the closed oil circuit; the oil intake device comprises an oil intake pipeline, an oil intake tank and an oil intake branch pipe; an upper end of the oil intake tank is connected to the oil distributor, and a lower end thereof is connected to the auxiliary oil tank; one side of the oil intake tank is connected to the oil intake branch pipe; the other end of the oil intake branch pipe is connected to the server housing or the liquid distributor; an oil intake regulating valve is further provided at the joint between the oil intake tank and the oil intake branch pipe; the oil return device comprises an oil return tank and an oil return pipeline; the auxiliary oil tank is connected to the main oil tank through an oil return pipeline; and the oil return port of the liquid distributor is in communication with the oil return tank.

Further, the cooling liquid oil is insulating liquid oil, including at least one of natural mineral oil, silicone oil, plant oil, transformer oil and heat transfer oil; the server housing is internally provided with cooling liquid oil; and the cooling liquid oil occupies 0%-50% of the space of the server housing.

The beneficial effects of the present invention are as follows:

1. a liquid cooling spray system is used, the specific heat capacity of cooling liquid oil is high, and the cooling liquid oil is in direct contact with a heating element, thus the heat transfer efficiency is high;

2. the device uses standardized module design, which not only meets the use requirements, but also meets the installation and assembly requirements, and in actual use, the device can satisfy all cabinet servers;

3. the device uses the standardized module design, which has considerable advantages for mass production and maintenance;

4. from a macro point of view, the overall fluidity of the oil is quite good, and all of the oil flows from top to bottom, which can meet the requirement of faster heat transfer;

5. during the whole process, the oil is in a flowing state, and there will be no local high temperature due to oil collection;

6. in the actual application in large engineering, the system uses a full gravity flow design, and the pump only needs to pump the liquid to a high place, so that not only does the system not need additional pump work to provide pressurized liquid to nozzles of the servers, but the system also does not need to consume pump work at pipelines and elbows, thus greatly reducing pump work as well as the costs of the pump, and being energy-saving and economical; and 7. by using the oil distributor, the flowing rate of the sprayed cooling liquid oil is uniform and the pressure is constant, thus ensuring the stability of the system and also prolonging the service life of the components.

The description above is only an overview of the technical solutions of the present invention. In order to more clearly understand the technical means of the present invention, so that same can be implemented according to the contents of the description, preferred embodiments of the present invention are described in detail below with reference to the accompanying drawings. Particular implementations of the present invention are given in detail by the following embodiments and accompanying drawings thereof.

BRIEF DESCRIPTION OF THE DRAWINGS

The drawings described herein are used to provide a further understanding of the present invention and constitute a part of the present application. The exemplary embodiments of the present invention and descriptions thereof are used to explain the present invention, and do not constitute improper limits to the present invention. In the drawings.

Figure 1:
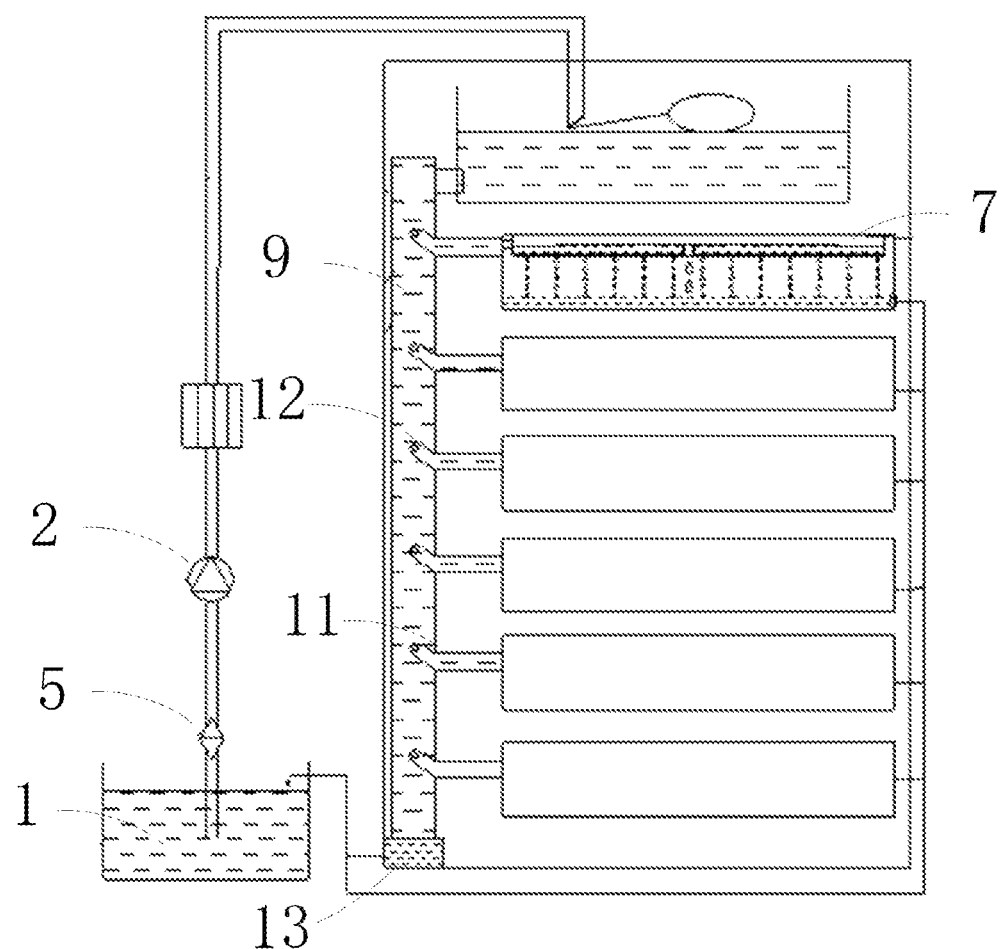
FIG. 1 is a schematic diagram of a gravity spray system of the present invention.

Description of reference numerals in the figures: main oil tank 1, pump 2, radiator 3, oil distributor 4, case 41, oil intake regulating valve 42, oil intake valve body 421, connecting rod 422, floating body 423, oil distribution inlet end 43, oil distribution unit 44, vent pipe 441, oil distribution outlet end 442, oil quantity regulator 443, diversion guide plate 444, bubble removing device 45, pressure relief pipe 46, pressure relief oil inlet 461, pressure relief oil outlet 462, pressure relief hole 463, respirator 47 filter 5, oil intake device 6, liquid distributor 7, oil return chamber 71, oil spray chamber 72, liquid distribution oil inlet 73, oil return port 74, overflow hole 75, spray hole 76, oil return device 8, oil intake tank 9, server housing 10, upper cover 101, fastener 102, seal 103, box 104, adapter plate 105, coolant intake pipe 106, closed flow channel 107, spray pressure chamber 108, spray hole 109, upper cover shell 110, insertion hole 111, heating chip area 112, partition 113, box shell 114, mounting post 115, coolant outlet pipe 116, oil intake branch pipe 11, oil intake regulating valve 12, auxiliary oil tank 13, oil intake switch valve 16, switch valve oil inlet 161, valve core 162, valve body 163, switch 164, and telescopic oil outlet 165.

DETAILED DESCRIPTION OF THE EMBODIMENTS

Hereinafter, the present invention will be described in detail with reference to the accompanying drawings and in conjunction with embodiments.

Figure 2:
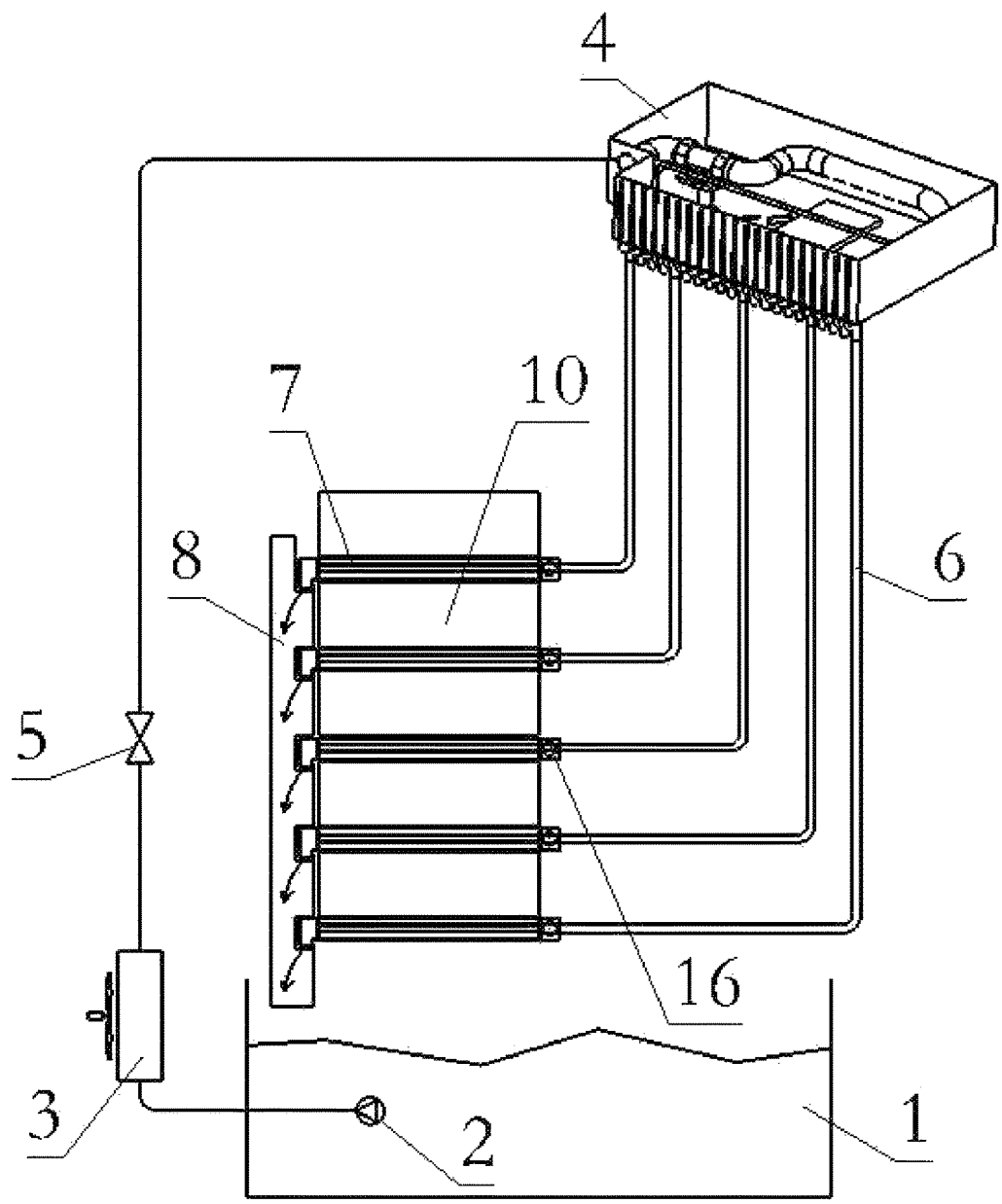
FIG. 2 is a schematic diagram of another gravity spray system of the present invention.

With reference to FIGS. 1-16, a gravity spray system of a data centre cabinet, as shown in FIGS. 1 and 2, comprises a main oil tank 1, a pump 2, a radiator 3, a data centre cabinet, an oil intake device 6, an oil return device 8 and cooling liquid oil. The main oil tank 1, the pump 2, the radiator 3 and the data centre cabinet are connected into a closed oil circuit by the oil intake device 6 and the oil return device 8. The cooling liquid oil is pumped out of the main oil tank 1 by the pump 2, and then, after passing through the radiator 3 for heat exchange, enters the oil distributor 4 in the data centre cabinet through a pipeline. The oil distributor 4 is located at an upper part of the data centre cabinet. The oil distributor 4 distributes oil, and the liquid distributor 7 distributes and sprays liquid to cool the server. The cooling liquid oil after the cooling treatment returns to the main oil tank 1 through the oil return device 8.

Preferably, the gravity spray system of the data centre cabinet further comprises a filter 5 and an auxiliary oil tank 13. The filter 5 is connected in the closed oil circuit. The oil intake device 6 comprises an oil intake pipeline, an oil intake tank 9 and an oil intake branch pipe 11. An upper end of the oil intake tank 9 is connected to the oil distributor 4, and a lower end thereof is connected to the auxiliary oil tank 13. One side of the oil intake tank 9 is connected to the oil intake branch pipe 11. The other end of the oil intake branch pipe 11 is connected to the server housing 10 or the liquid distributor 7. An oil intake regulating valve 12 is further provided at the joint between the oil intake tank 9 and the oil intake branch pipe 11. The oil return device 8 comprises an oil return tank and an oil return pipeline. The auxiliary oil tank 13 is connected to the main oil tank 1 via an oil return pipeline. The oil return port 74 of the liquid distributor 7 is in communication with the oil return tank. As shown in FIGS. 1 and 2, the position of the filter 5 is not limited, and whether the filter is disposed in front of the pump 2 or behind the pump 2 or behind the radiator 3 should be within the scope of protection of the present invention.

A data centre cabinet, as shown in FIG. 2, comprises a cabinet body, an oil distributor 4 and a plurality of liquid distributors 7. The cabinet body comprises a plurality of mounting racks. The cabinet body is sequentially mounted with a plurality of server housings 10 from high to low. A server is placed in the server housing 10. One of the liquid distributors 7 is provided above each of the server housings 10. The oil distributor 4 is mounted above all the liquid distributors 7. The oil distributor 4 is connected to the liquid distributors 7 via an oil intake device 6. Cooling liquid oil is distributed and flows to the liquid distributors 7 through the oil distributor 4, and the liquid distributors 7 spray the cooling liquid oil to the server for cooling. Generally, in order to ensure the overall structural strength of the cabinet, the cabinet body is made of a metal material. In particular, a flexible material can also be used to manufacture the cabinet body.

Figure 3:
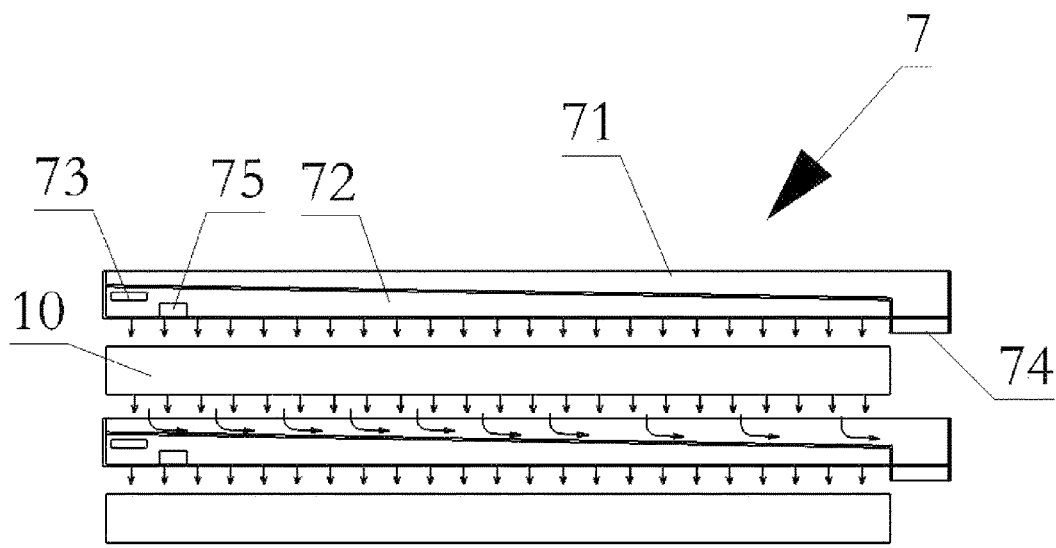
FIG. 3 is a schematic diagram of a liquid distributor and liquid distribution of a server.
Figure 4:
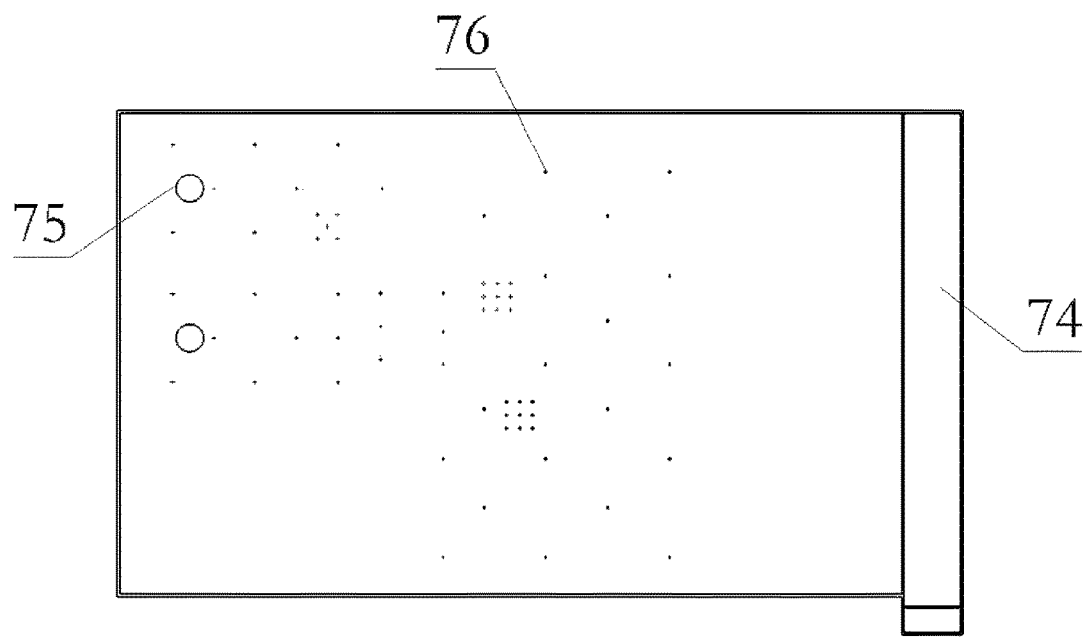
FIG. 4 is a schematic diagram of a planar structure of the liquid distributor.

Preferably, as shown in FIGS. 3 and 4, the liquid distributor 7 comprises an oil return chamber 71, an oil spray chamber 72, a liquid distribution oil inlet 73 and an oil return port 74; the oil return chamber 71 is positioned above the oil spray chamber 72; the liquid distribution oil inlet 73 is positioned in the oil spray chamber 72; a lower bottom face of the oil spray chamber 72 is provided with a spray hole 76; the spray hole 76 is directly opposite the server; the oil return chamber 71 receives the cooling liquid oil flowing through the server above the liquid distributor 7; and the oil return port 74 is used for discharging the cooling liquid oil in the oil return chamber 71. Preferably, the liquid distributor 7 further comprises an overflow hole 75; the overflow hole 75 is provided on the lower bottom face of the oil spray chamber 72; the overflow hole 75 is higher than the lower bottom face of the oil spray chamber 72; and the oil return chamber 71 is at an included angle to the horizontal plane. As shown in FIG. 2, the oil return port 74 is directly opposite the oil return tank of the oil return device 8, and the cooling liquid oil returning from the oil return port 74 flows into the main oil tank 1 through the oil return tank. The liquid distributor 7 corresponding to each layer of server is provided with a plurality of overflow holes 75, and the height of the overflow holes 75 is 5-20 mm higher than that of an oil spray plate, so as to ensure the depth of an oil level in the oil spray chamber 72. When the amount of oil intake is greater than the amount of oil sprayed (for example, when a single layer of server is serviced), the excess amount of oil enters the server through the overflow holes 75. The overflow holes 75 are located in a region where heating elements are relatively concentrated, thereby improving the heat dissipation efficiency of the server.

It should be understood that the liquid distributor 7 is used to practically distribute the cooling liquid oil after distribution in the oil distributor 4 according to the actual position to be cooled. Generally, the liquid distributor 7 is manufactured separately from the server housing 10. The liquid distributor 7 is installed on the server housing 10 as the structure shown in FIGS. 3 and 4, and the server housing 10 is of an open structure.

Figure 14:
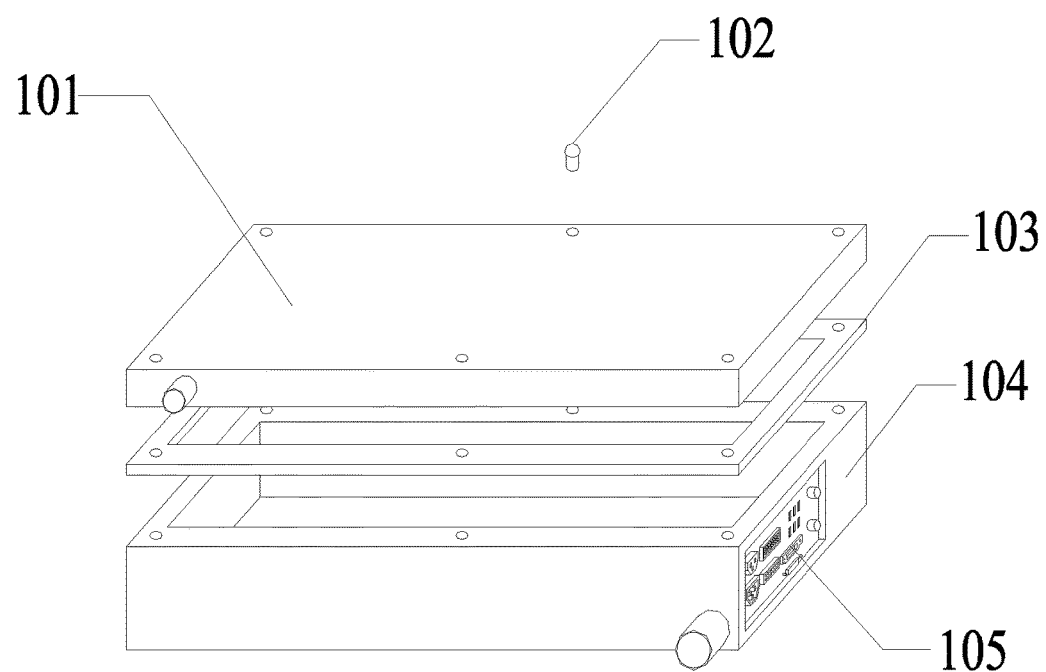
FIG. 14 is a structural schematic diagram of a server subrack of the present invention.
Figure 15:
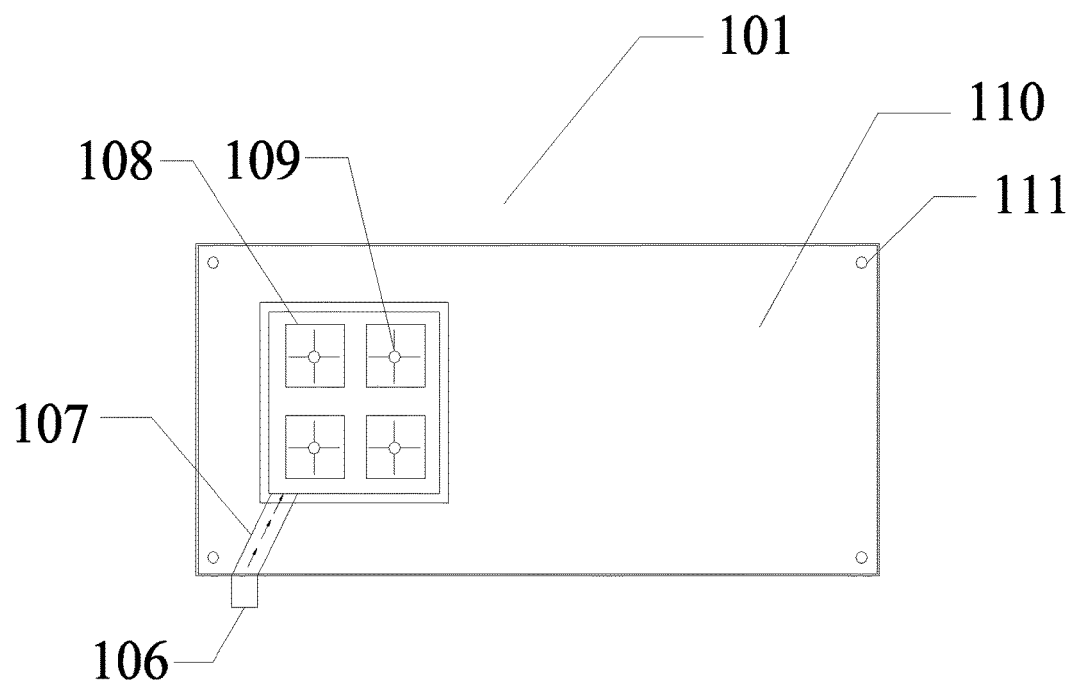
FIG. 15 is a first schematic diagram of the interior of the server subrack of the present invention.
Figure 16:
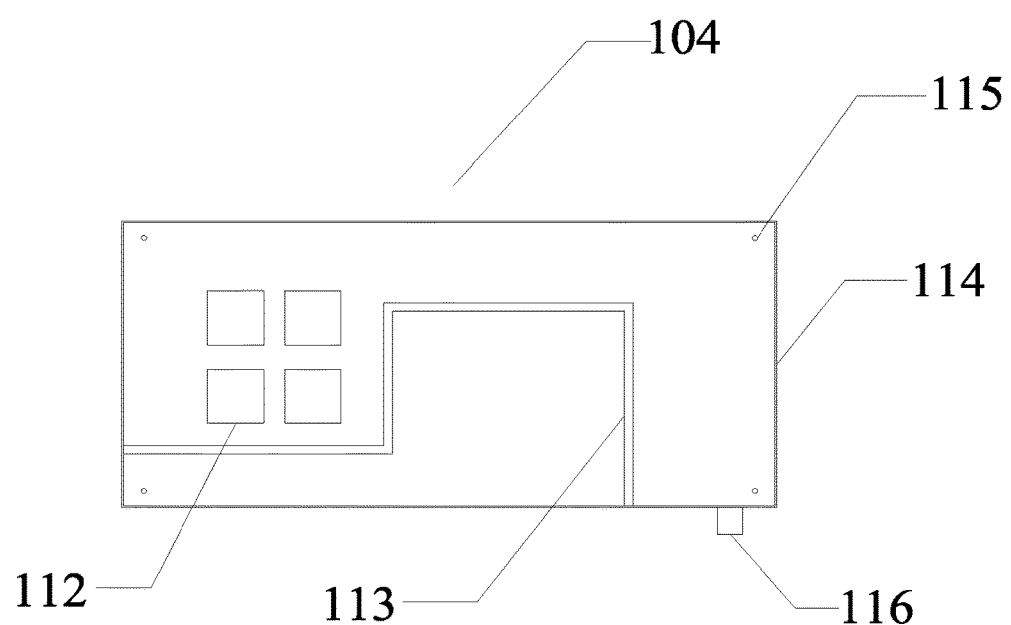
FIG. 16 is a second schematic diagram of the interior of the server subrack of the present invention.

In another embodiment, as shown in FIGS. 14-16, the server housing 10 is preferably a server subrack when specifically implemented. From the manufacturing process, the liquid distribution function or overflow function of the liquid distributor 7 is combined with the server subrack structure. The server subrack comprises an upper cover 101 and a box 104. The upper cover 101 is fixed on the box 104. The upper cover 101 comprises a coolant intake pipe 106, at least one spray pressure chamber 108, at least one spray hole 109 and an upper cover shell 110, and the box 104 comprises a box shell 114 and a coolant outlet pipe 116. An inner surface of the upper cover shell 110 is provided with the spray pressure chamber 108, the coolant intake pipe 106 is connected to the spray pressure chamber 108, and each spray pressure chamber 108 is provided with the spray hole 109. The spray hole 109 is directly opposite a heating chip area 112 of the server. Preferably, the box 104 is internally provided with a flow channel, and the coolant outlet pipe 116 is in communication with the flow channel The server subrack further comprises a seal 103, and the upper cover 101 is hermetically installed with the box 104 through the seal 103. The inner surface of the box shell 114 is also provided with a partition 113. The flow channel and the heating chip area 112 of the server are located on the same side of the partition 113. In this embodiment, the server is divided into a heating chip area 112 and a non-main heating area by the partition 113 in the server subrack, i.e., the liquid flow channel in the server subrack is planned to further ensure the central heat dissipation to the heating area and improve the heat dissipation efficiency. Preferably, as shown in FIG. 14, an adapter plate 105 may be provided on the outer side of the box shell 114. The adapter plate 105 is provided with various sockets or interfaces for connecting storage devices and other servers.

Preferably, as shown in FIG. 15, the upper cover 101 further comprises a closed flow channel pipe 107, and the coolant intake pipe 106 is connected to the spray pressure chamber 108 via the closed flow channel pipe 107. The use of the closed flow channel pipe 107 can ensure that the coolant intake pipe 106 is better connected to the spray pressure chamber 108, and can facilitate the rational arrangement of the spray pressure chamber 108 on the inner surface of the upper cover shell 110.

Preferably, as shown in FIGS. 14-16, the server subrack further comprises fasteners 102; a plurality of insertion holes 111 are arranged at an edge of the upper cover shell 110; a number of through holes are arranged at an edge of the seal 103;

the through holes correspond to the insertion holes 111; a plurality of mounting posts 115 are arranged at an edge of the box shell 114; and the mounting posts 115 correspond to the insertion holes 111 and the through holes. The fasteners 102 cooperate with the insertion holes 111, the through holes and the mounting posts 115. The upper cover 101, the seal 103 and the box 104 are fixedly connected together through the fasteners 102. The fasteners can be connected to the mounting posts 115 by pins or threads, and that the insertion holes or through holes are arranged at the edges of the upper cover shell and the seal 103 does not affect the arrangement of key structures therein and is also convenient to disassemble and assemble. Preferably, the coolant intake pipe 106 is horizontally disposed on one side of the upper cover shell 110, the coolant outlet pipe 116 is horizontally disposed on one side of the box shell 114, and the coolant intake pipe 106 is located above the coolant outlet pipe 116. The coolant outlet pipe 116 is located below the coolant intake pipe 106, which is advantageous for the coolant to be discharged from top to bottom under gravity. The coolant intake pipe 106 is located above the coolant outlet pipe 116, and that the coolant enters the box will not be hindered by gravity. Preferably, in order to ensure that the bottom of the box 104 has a small amount of residual coolant, the coolant outlet pipe 116 is higher than the bottom of the box shell 114. The residual coolant can be used to partially soak and cool the server, but the residual coolant should not pass over the upper surface of the server and will not affect the spraying effect. Preferably, in order to allow the coolant to smoothly and quickly flow out of the server subrack, based on the principle of gravity, the bottom face on the inner side of the box shell 114 is at an included angle to the horizontal plane.

Figure 5:
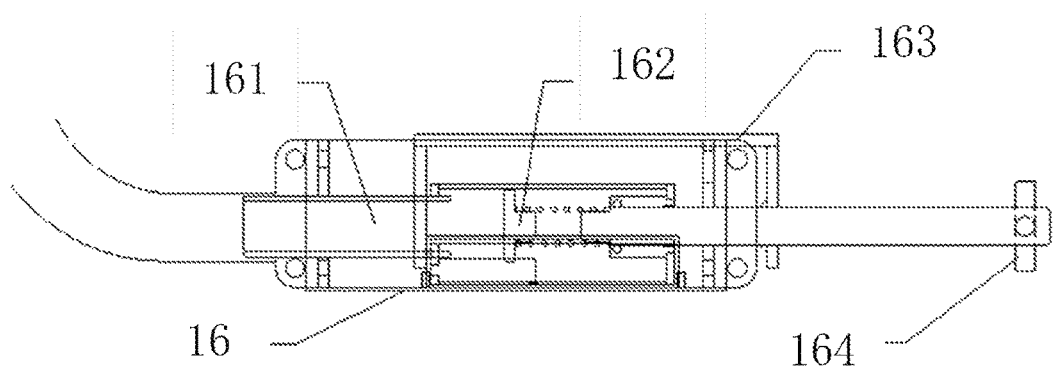
FIG. 5 is a schematic diagram of the internal structure of an oil intake switch valve of the present invention.
Figure 6:
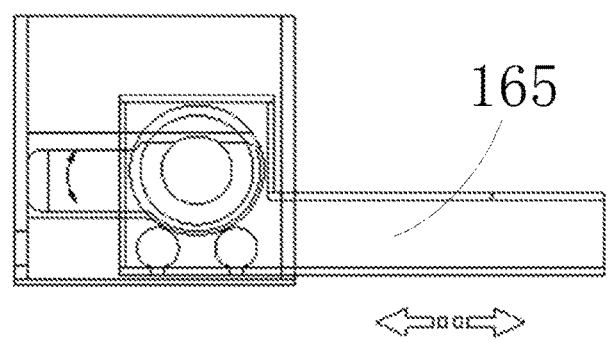
FIG. 6 is a top view of the oil intake switch valve of the present invention.

Preferably, as shown in FIGS. 5 and 6, the data centre cabinet further comprises an oil intake switch valve 16; the oil intake switch valve 16 is installed at the joint between the server housing 10 and the oil intake device 6 and the joint between the liquid distributor 7 and the oil intake device 6; the oil intake switch valve 16 comprises a switch valve oil inlet 161, a valve core 162, a valve body 163, a switch 164 and a telescopic oil outlet 165; the switch valve oil inlet 161 is connected to the oil intake device 6; and the switch 164 controls the valve core 162 and the telescopic oil outlet 165. The oil intake switch valve controls the opening and closing of the cooling liquid oil entering the liquid distributor 7 and also realizes the extension and retraction of the telescopic oil outlet 165. During operation, the oil intake switch valve 16 is in an open state, the switch valve core 162 is at a certain distance from the oil inlet, and at this time the telescopic oil outlet 165 is also in an extended state, and thus cooling liquid oil flows into the liquid distributor 7 through the oil inlet 161 and the telescopic oil outlet 165. When the server needs maintenance, a handle switch 164 is rotated to drive the switch valve core 162 to rotate and move towards the direction of the oil inlet 161 to close the oil inlet 161, while the telescopic oil inlet 165 is retracted to close the liquid flow space, so as to ensure that the server is not affected by the liquid when pulled out for service.

As shown in FIGS. 7-10, an oil distributor 4 is provided. The oil distributor 4 comprises a case 41, at least one oil distribution inlet end 43 and a plurality of oil distribution units 44. The plurality of oil distribution units are mounted in the case 41. The oil distribution unit 44 comprises an oil distribution outlet end 442. Cooling liquid oil enters the oil distributor 4 from the oil distribution inlet end 43 and flows to each cooling branch from the oil distribution outlet end 442.

Figure 10:
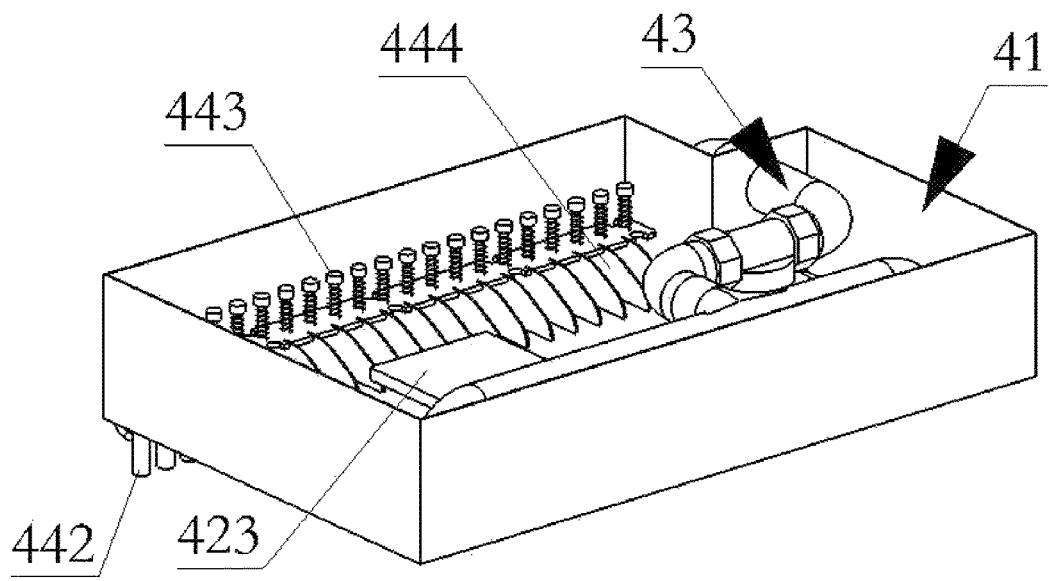
FIG. 10 is a second schematic diagram of the internal structure of the oil distribution device of the present invention.
Figure 11:
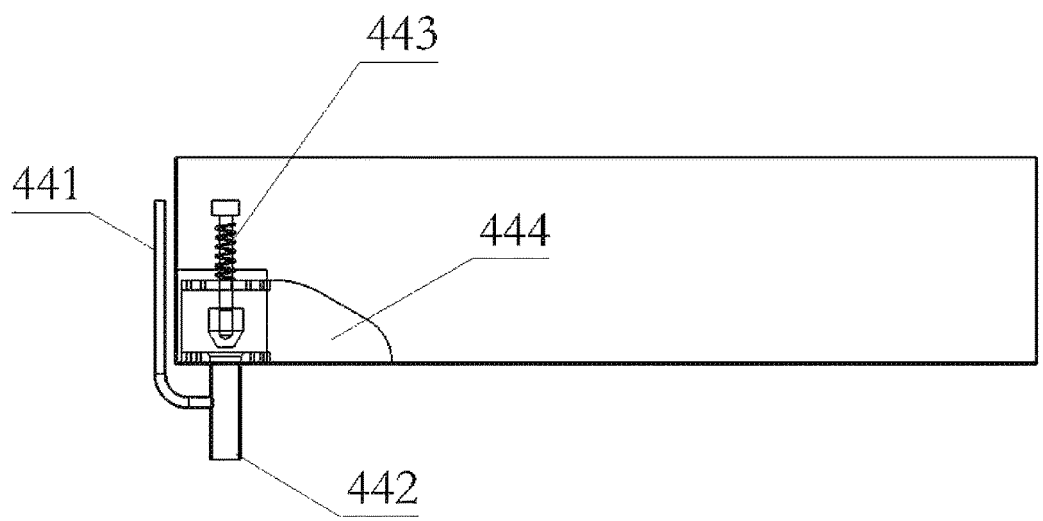
FIG. 11 is a schematic diagram of the structure of an oil distribution unit of the present invention.
Figure 12:
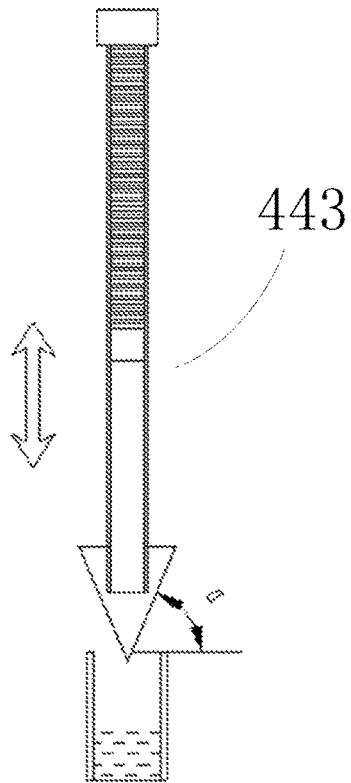
FIG. 12 is a schematic diagram of the principle of an oil distribution regulator of the present invention.

Preferably, as shown in FIGS. 10-12, the oil distribution unit 44 further comprises a vent pipe 441, an oil quantity regulator 443 and a diversion guide plate 444. The oil quantity regulator 443 is directly opposite the oil distribution outlet end 442, and the oil quantity regulator 443 controls the oil quantity discharged at the oil distribution outlet end 442. The diversion guide plate 444 separates each of the oil distribution units 44 into an independent unit. The diversion guide plate 444 distributes and guides the flow of oil to form a plurality of independent channels in the housing, each channel corresponding to an oil distribution port, so that the oil quantity finally flowing into the oil distribution port is kept consistent, and the oil quantity regulator 443 of each oil distribution unit 44 can independently control the oil outlet pressure and the oil quantity discharged at each oil distribution unit 44. The vent pipe 441 is in communication with the oil distribution outlet end 442 to counterbalance the oil outlet pressure at the oil distribution outlet end 442. Preferably, the oil quantity regulator 443 comprises a cone, an elastic member and a pressing rod. The pressing rod is fixedly mounted on one side of the case 41. The cone is fixed at a lower end of the pressing rod. The cone is directly opposite the oil distribution outlet end 442. The elastic member adjusts the distance between the cone and the oil distribution outlet end 442. As shown in FIG. 12, the height of the pressing rod is adjusted such that the included angle α between the oil distribution outlet end 442 and the cone reaches a suitable degree, and the cooling liquid oil flows to the server along this space angle. As shown in FIG. 2, the entire oil distributor 4 is mounted at an upper part of the entire cooling equipment. The cooling liquid oil in the oil distributor 4 enters the server to be cooled under gravity. According to the difference in height between the oil distribution outlet end 442 and the server to be cooled, α is adjusted to ensure that the cooling liquid oil flowing out of the oil distribution outlet ends 442 of the oil distribution units 44 flows at the same speed and at the same pressure.

Figure 9:
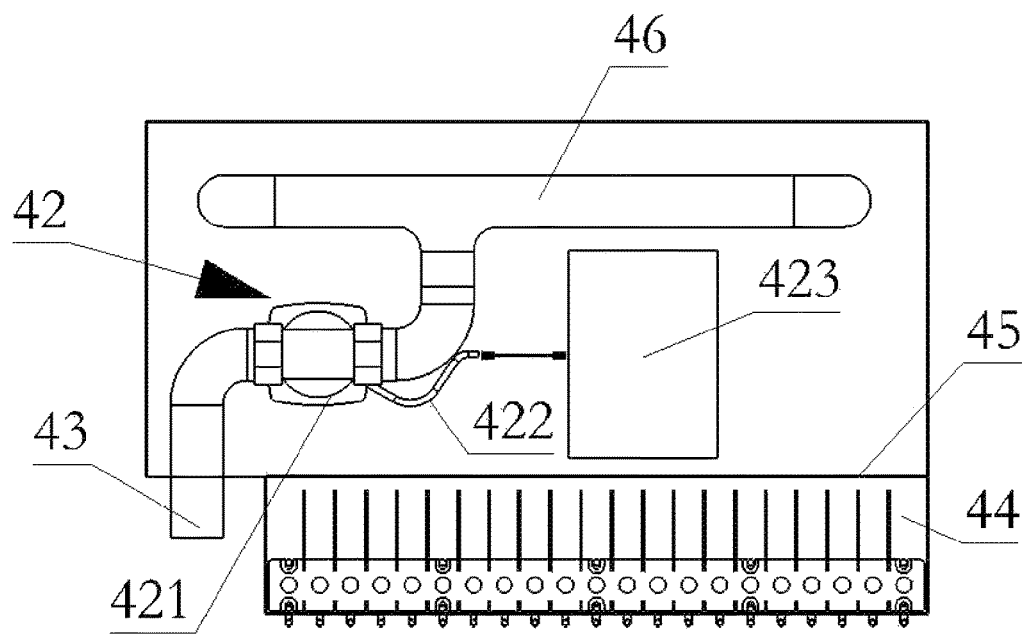
FIG. 9 is a top view of the internal structure of the oil distribution device of the present invention.

Preferably, as shown in FIG. 9, the oil distributor 4 further comprises an oil intake regulating valve 42. The oil intake regulating valve 42 is connected to the oil distribution inlet end 43 via a pipeline. The oil intake regulating valve 42 comprises an oil intake valve body 421, a connecting rod 422 and a floating body 423. The floating body 423 ascends and drives the connecting rod 422 to move, so as to close the oil intake valve body 421.

Figure 8:
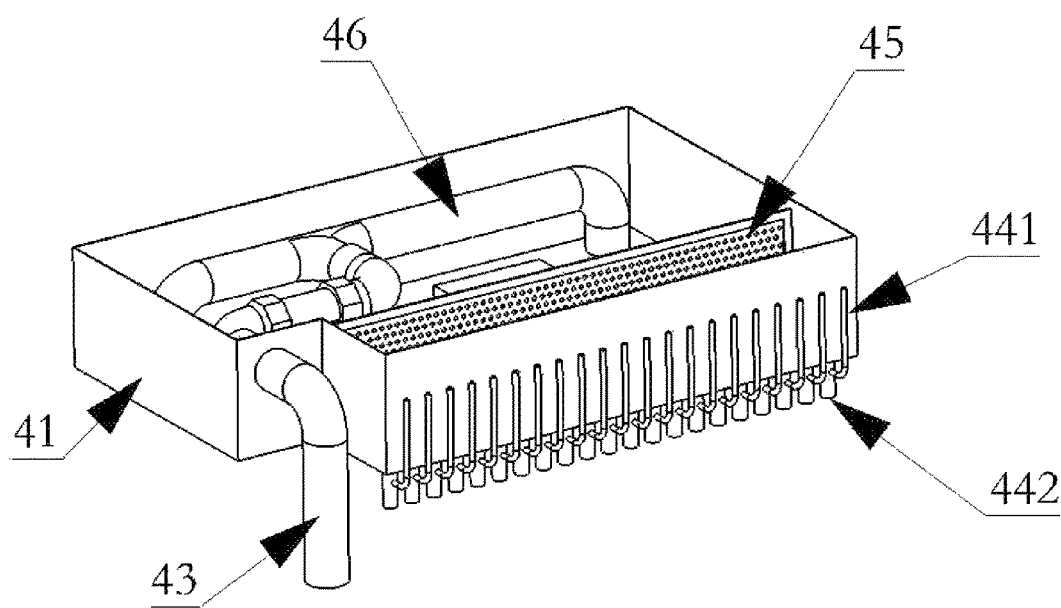
FIG. 8 is a first schematic diagram of the internal structure of the oil distribution device of the present invention.

Preferably, as shown in FIG. 8, the oil distributor 4 further comprises a bubble removing device 45. The bubble removing device 45 is mounted adjacent to the oil distribution unit 44. Preferably, the bubble removing device 45 is a screen mesh or a perforated plate. With the barrier of the screen mesh or perforated plate, bubbles mixed in the cooling liquid oil pumped in cannot enter the oil distribution unit 44, thus ensuring the purity of the cooling liquid oil flowing out of the oil distribution outlet end 442 of the oil distribution unit 44.

Figure 13:
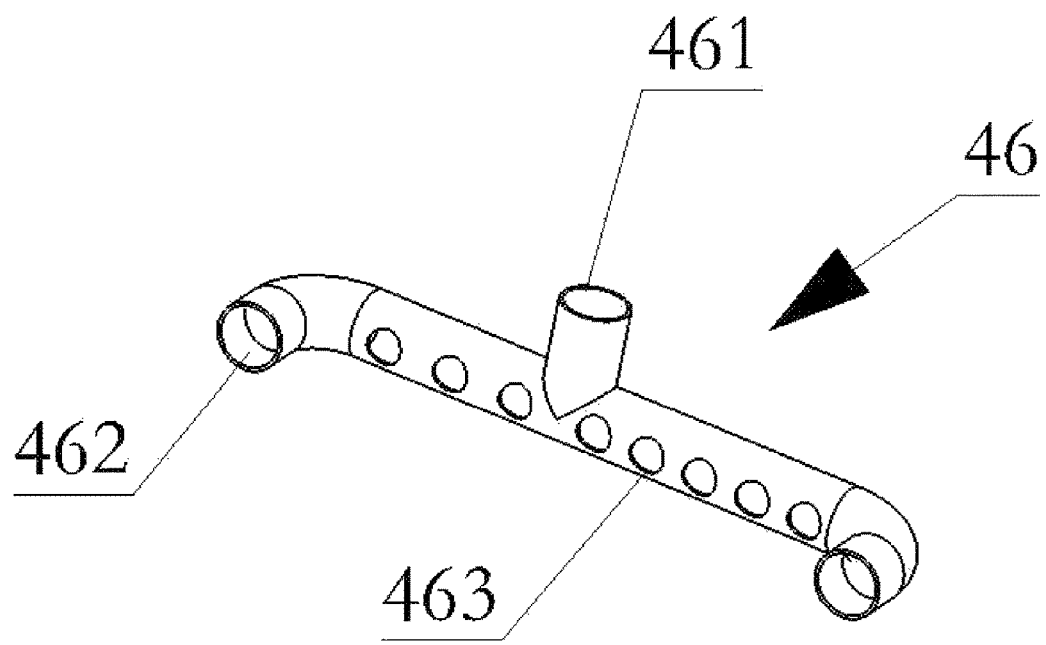
FIG. 13 is a schematic diagram of the structure of a pressure relief pipe of the present invention.

Preferably, as shown in FIG. 13, the oil distributor 4 further comprises a pressure relief pipe 46. The pressure relief pipe 46 comprises at least one pressure relief oil inlet 461, at least one pressure relief oil outlet 462 and a plurality of pressure relief holes 463. The pressure relief oil inlet 461 is connected to the oil intake regulating valve 42. The plurality of pressure relief holes 463 is located on a pipe wall of the pressure relief pipe 46. The plurality of pressure relief holes 463 provided on the pressure relief pipe 46 prevent the pressure of the cooling liquid oil pumped in from being too high, causing unnecessary impact on the oil distributor 4 and other pipelines and elements and then damaging the equipment.

Figure 7:
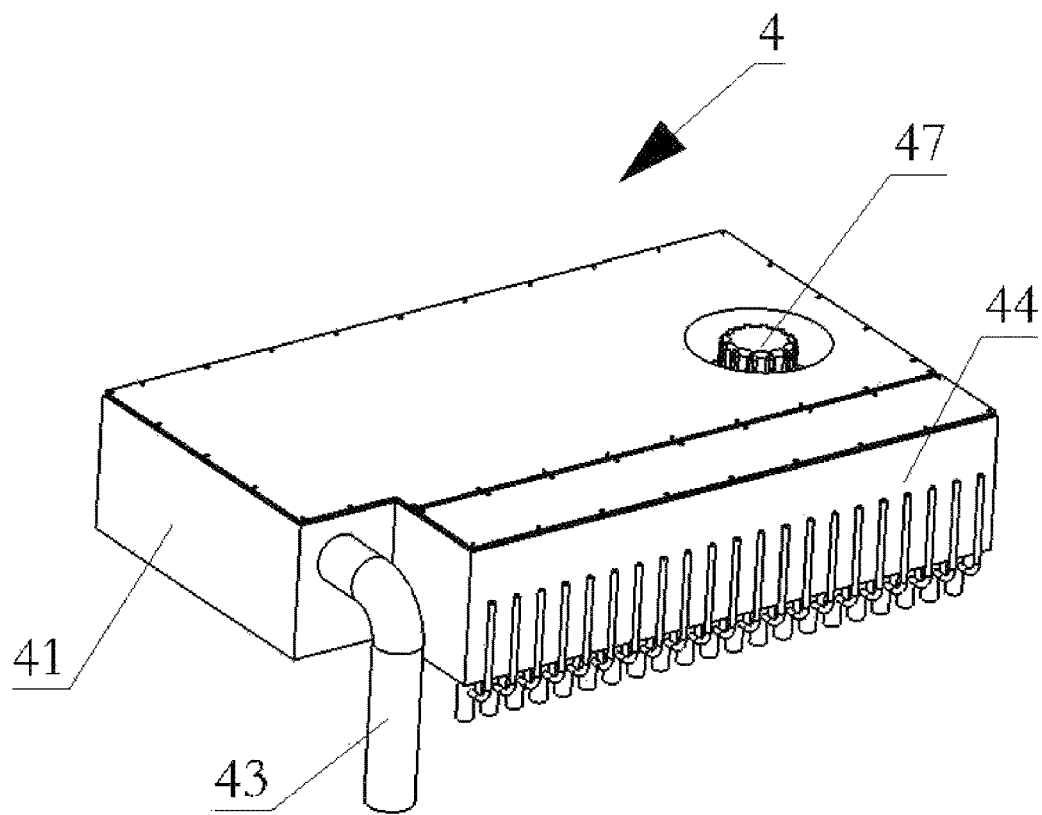
FIG. 7 is an overall schematic diagram of an oil distribution device of the present invention.

Preferably, as shown in FIG. 7, the oil distributor 4 further comprises a respirator 47. The respirator 47 is mounted on an upper cover of the case 41. The respirator 47 is used for allowing the air inside the oil distributor 4 to be in communication with the outside air. The respirator is designed to prevent the oil distributor from forming closed high pressure and damaging pipelines and other equipment.

An oil distribution method for gravity spray cooling comprises the following steps of:

oil intake, wherein cooling liquid oil is pumped into the oil distributor 4;

oil quantity regulation, wherein the quantity of the cooling liquid oil stored in the oil distributor 4 is controlled by the oil intake regulating valve 42, and the position of the connecting rod 422 is adjusted, so as to adjust the position where the floating body 423 floats to close the oil intake regulating valve 42;

pressure relief regulation, wherein the oil pressure of the cooling liquid oil pumped in is buffered through the plurality of pressure relief holes 463 arranged on the pressure relief pipe 46;

bubble treatment, wherein bubbles in the cooling liquid oil are isolated through small holes in the bubble removing device 45; and oil distribution treatment, wherein the distance between the cone and the oil distribution outlet end 442 is adjusted by adjusting the elastic member to match the height differences between the oil distribution outlet end 442 and the equipment to be cooled.

Preferably, the cooling liquid oil is insulating liquid oil, including at least one of natural mineral oil, silicone oil, plant oil, transformer oil and heat transfer oil; the server housing 10 is internally provided with cooling liquid oil; and the cooling liquid oil occupies 0%-50% of the space of the server housing 10. In order to achieve a better cooling effect, the cooling liquid oil in the server housing 10 maintains a certain liquid level height. The cooling liquid oil fully contacts the main heating elements of the server and absorbs heat. After being collected through the oil return pipeline, the cooling liquid oil flowing back from each layer of server returns again into the main oil tank 1.

According to the present invention, on the one hand, as cooling liquid oil is concentrated in an oil distributor tank disposed above, the oil automatically flows along an oil passage under gravity, and there is no need to provide pressure in the oil passage, thus reducing the power consumption of an oil pump, improving the coefficient of performance (COP) of the heat dissipation system and reducing the overall Power usage effectiveness (PUE) of the data centre. On the other hand, to solve the problem that the height differences between the servers in the cabinet caused by the top-down arrangement lead to inconsistent distribution quantity of the oil in a gravity oil distribution circuit, an oil quantity regulator in an oil distribution unit is used to ensure consistent flow rate distributed to each layer of server. The present invention is ingenious in design, rational in structure and innovative in method, breaks through the traditional cooling manner for large servers, has strong practicability and is convenient for popularization.

1. A liquid cooling spray system is used in the present invention, the specific heat capacity of cooling liquid oil is high, and the cooling liquid oil is in direct contact with a heating element, thus the heat transfer efficiency is high.

2. The present invention uses standardized module design, which not only meets the use requirements, but also meets the installation and assembly requirements. In actual use, the device can satisfy all cabinet servers.

3. The present invention uses standardized module design, which has considerable advantages for mass production and maintenance.

4. From a macro point of view, the overall fluidity of the oil is quite good, and all of the oil flows from top to bottom, which can meet the requirement of faster heat transfer.

5. According to the present invention, during the whole process, the cooling liquid oil is in a flowing state, and there will be no local high temperature due to oil collection.

6. According to the present invention, in the actual application in large engineering, the system uses a full gravity flow design, and the pump only needs to pump the liquid to a high place, so that not only does the system not need additional pump work to provide pressurized liquid to nozzles of the servers, but the system also does not need to consume pump work at pipelines and elbows, thus greatly reducing pump work as well as the costs of the pump, and being energy-saving and economical.

7. The present invention uses an oil distributor, so that the flowing rate of the sprayed cooling liquid oil is uniform and the pressure is constant, thus ensuring the stability of the system and also prolonging the service life of the components.

The foregoing has merely described preferred embodiments of the present invention, and is not intended to limit the present invention in any form. Any person of ordinary skill in the industry can smoothly implement the present invention as shown in the accompanying drawings and the foregoing of the description. However, equivalent changes such as alterations, modifications or variations made by those skilled in the art from the technical contents disclosed above without departing from the scope of the technical solutions of the present invention are all equivalent embodiments of the present invention. In addition, any equivalent changes such as alterations, modifications or variations to the above embodiments according to the technical essence of the present invention are still within the scope of protection of the technical solutions of the present invention.

We claim:

1. A data centre cabinet, comprising:
a cabinet body;
an oil distributor; and
a plurality of liquid distributors; and
wherein the cabinet body comprises a plurality of mounting racks;
the cabinet body is sequentially mounted with a plurality of server housings from top to bottom;
a server is placed in each server housing of the plurality of server housings;
one of the plurality of liquid distributors is provided above each server housing;
the oil distributor is mounted above the plurality of liquid distributors;
the oil distributor is connected to each liquid distributor of the plurality of liquid distributors via an oil intake device;
a cooling liquid oil is distributed and flows to the each liquid distributor through the oil distributor, and the plurality of liquid distributors spray the cooling liquid oil to the servers for cooling;
the oil distributor comprises a case, the at least one oil distribution inlet end and a plurality of oil distribution units;
the plurality of oil distribution units are mounted in the case;
each oil distribution unit of the plurality of oil distribution units comprises an oil distribution outlet end and an oil quantity regulator, the oil quantity regulator is directly opposite to the oil distribution outlet end, and the oil quantity regulator controls an oil quantity discharged at the oil distribution outlet end; and
the cooling liquid oil enters the oil distributor from the at least one oil distribution inlet end, and the oil distributor is connected to the each liquid distributor via the oil distribution outlet end.

2. The data centre cabinet according to claim 1, wherein the each oil distribution unit further comprises a vent pipe and a diversion guide plate; the diversion guide plate separates the each oil distribution unit into an independent unit; the vent pipe is in communication with the oil distribution outlet end; the oil quantity regulator comprises a cone, an elastic member and a pressing rod; the pressing rod is fixedly mounted on one side of the case; the cone is fixed at a lower end of the pressing rod; the cone is directly opposite to the oil distribution outlet end; and the elastic member adjusts a distance between the cone and the oil distribution outlet end.

3. The data centre cabinet according to claim 2, wherein the oil distributor further comprises an oil intake regulating valve, a bubble removing device, a pressure relief pipe and a respirator; the oil intake regulating valve is connected to the at least one oil distribution inlet end via a pipeline; the oil intake regulating valve comprises an oil intake valve body, a connecting rod and a floating body; the floating body ascends and drives the connecting rod to move, so as to close the oil intake valve body; the bubble removing device is mounted adjacent to the plurality of oil distribution units; the pressure relief pipe comprises at least one pressure relief oil inlet, at least one pressure relief oil outlet and a plurality of pressure relief holes; the at least one pressure relief oil inlet is connected to the oil intake regulating valve; the plurality of pressure relief holes are located on a pipe wall of the pressure relief pipe; the respirator is mounted on an upper cover of the case; and the respirator is configured to provide for air inside the oil distributor to be in communication with outside air.

4. The data centre cabinet according to claim 3, wherein the each liquid distributor comprises an oil return chamber, an oil spray chamber, a liquid distribution oil inlet and an oil return port; the oil return chamber is positioned above the oil spray chamber; the liquid distribution oil inlet is positioned in the oil spray chamber; a lower bottom face of the oil spray chamber is provided with a spray hole; the spray hole is directly opposite to a respective one of the servers below the each liquid distributor; the oil return chamber receives the cooling liquid oil from another respective one of the servers above the each liquid distributor; and the oil return port is configured for discharging the cooling liquid oil in the oil return chamber.

5. The data centre cabinet according to claim 4, wherein the each liquid distributor further comprises an overflow hole; the overflow hole is provided on the lower bottom face of the oil spray chamber; the overflow hole is at a position higher than the lower bottom face of the oil spray chamber; and an included angle is provided between the oil return chamber and a horizontal plane.

6. The data centre cabinet according to claim 5, wherein the data centre cabinet further comprises an oil intake switch valve; the oil intake switch valve is installed at a joint between the each server housing and the oil intake device and a joint between the each liquid distributor and the oil intake device; the oil intake switch valve comprises a switch valve oil inlet, a valve core, a valve body, a switch and a telescopic oil outlet; the switch valve oil inlet is connected to the oil intake device; and the switch controls the valve core and the telescopic oil outlet.

7. The data centre cabinet according to claim 3, wherein the each server housing comprises an upper cover and a box; the upper cover is fixed on the box; the upper cover comprises a coolant intake pipe, at least one spray pressure chamber, at least one spray hole and an upper cover shell, and the box comprises a box shell and a coolant outlet pipe; an inner surface of the upper cover shell is provided with the at least one spray pressure chamber, the coolant intake pipe is connected to the at least one spray pressure chamber, and the at least one spray pressure chamber is provided with the spray hole; and the at least one spray hole is directly opposite to a heating chip area of the server.

8. The data centre cabinet according to claim 7, wherein the box is internally provided with a flow channel, and the coolant outlet pipe is in communication with the flow channel; the each server housing further comprises a seal, and the upper cover is hermetically installed with the box through the seal; an inner surface of the box shell is further provided with a partition; and the flow channel and the heating chip area of the server are located on a same side of the partition.

9. The data centre cabinet according to claim 8, wherein the data centre cabinet further comprises an oil intake switch valve; the oil intake switch valve is installed at a joint between the each server housing and the oil intake device and a joint between the each liquid distributor and the oil intake device; the oil intake switch valve comprises a switch valve oil inlet, a valve core, a valve body, a switch and a telescopic oil outlet; the switch valve oil inlet is connected to the oil intake device; and the switch controls the valve core and the telescopic oil outlet.

10. The data centre cabinet according to claim 7, wherein the data centre cabinet further comprises an oil intake switch valve; the oil intake switch valve is installed at a joint between the each server housing and the oil intake device and a joint between the each liquid distributor and the oil intake device; the oil intake switch valve comprises a switch valve oil inlet, a valve core, a valve body, a switch and a telescopic oil outlet; the switch valve oil inlet is connected to the oil intake device; and the switch controls the valve core and the telescopic oil outlet.

11. The data centre cabinet according to claim 2, wherein the each liquid distributor comprises an oil return chamber, an oil spray chamber, a liquid distribution oil inlet and an oil return port; the oil return chamber is positioned above the oil spray chamber; the liquid distribution oil inlet is positioned in the oil spray chamber; a lower bottom face of the oil spray chamber is provided with a spray hole; the spray hole is directly opposite to a respective one of the servers below the each liquid distributor; the oil return chamber receives the cooling liquid oil from another respective one of the servers above the each liquid distributor; and the oil return port is configured for discharging the cooling liquid oil in the oil return chamber.

12. The data centre cabinet according to claim 11, wherein the each liquid distributor further comprises an overflow hole; the overflow hole is provided on the lower bottom face of the oil spray chamber; the overflow hole is at a position higher than the lower bottom face of the oil spray chamber; and an included angle is provided between the oil return chamber and a horizontal plane.

13. The data centre cabinet according to claim 12, wherein the data centre cabinet further comprises an oil intake switch valve; the oil intake switch valve is installed at a joint between the each server housing and the oil intake device and a joint between the each liquid distributor and the oil intake device; the oil intake switch valve comprises a switch valve oil inlet, a valve core, a valve body, a switch and a telescopic oil outlet; the switch valve oil inlet is connected to the oil intake device; and the switch controls the valve core and the telescopic oil outlet.

14. The data centre cabinet according to claim 2, wherein the each server housing comprises an upper cover and a box; the upper cover is fixed on the box; the upper cover comprises a coolant intake pipe, at least one spray pressure chamber, at least one spray hole and an upper cover shell, and the box comprises a box shell and a coolant outlet pipe; an inner surface of the upper cover shell is provided with the at least one spray pressure chamber, the coolant intake pipe is connected to the at least one spray pressure chamber, and the spray pressure chamber is provided with the at least one spray hole; and the at least one spray hole is directly opposite to a heating chip area of the server.

15. The data centre cabinet according to claim 14, wherein the box is internally provided with a flow channel, and the coolant outlet pipe is in communication with the flow channel; the each server housing further comprises a seal, and the upper cover is hermetically installed with the box through the seal; an inner surface of the box shell is further provided with a partition; and the flow channel and the heating chip area of the server are located on a same side of the partition.

16. The data centre cabinet according to claim 15, wherein the data centre cabinet further comprises an oil intake switch valve; the oil intake switch valve is installed at a joint between the each server housing and the oil intake device and a joint between the each liquid distributor and the oil intake device; the oil intake switch valve comprises a switch valve oil inlet, a valve core, a valve body, a switch and a telescopic oil outlet; the switch valve oil inlet is connected to the oil intake device; and the switch controls the valve core and the telescopic oil outlet.

17. The data centre cabinet according to claim 14, wherein the data centre cabinet further comprises an oil intake switch valve; the oil intake switch valve is installed at a joint between the each server housing and the oil intake device and a joint between the each liquid distributor and the oil intake device; the oil intake switch valve comprises a switch valve oil inlet, a valve core, a valve body, a switch and a telescopic oil outlet; the switch valve oil inlet is connected to the oil intake device; and the switch controls the valve core and the telescopic oil outlet.

18. The data centre cabinet according to claim 1, wherein the each liquid distributor comprises an oil return chamber, an oil spray chamber, a liquid distribution oil inlet and an oil return port; the oil return chamber is positioned above the oil spray chamber; the liquid distribution oil inlet is positioned in the oil spray chamber; a lower bottom face of the oil spray chamber is provided with a spray hole; the spray hole is directly opposite to a respective one of the servers below the each liquid distributor; the oil return chamber receives the cooling liquid oil from another respective one of the servers above the each liquid distributor; and the oil return port is configured for discharging the cooling liquid oil in the oil return chamber.

19. The data centre cabinet according to claim 18, wherein the each liquid distributor further comprises an overflow hole; the overflow hole is provided on the lower bottom face of the oil spray chamber; the overflow hole is at a position higher than the lower bottom face of the oil spray chamber; and an included angle is provided between the oil return chamber and a horizontal plane.

20. The data centre cabinet according to claim 19, wherein the data centre cabinet further comprises an oil intake switch valve; the oil intake switch valve is installed at a joint between the each server housing and the oil intake device and a joint between the each liquid distributor and the oil intake device; the oil intake switch valve comprises a switch valve oil inlet, a valve core, a valve body, a switch and a telescopic oil outlet; the switch valve oil inlet is connected to the oil intake device; and the switch controls the valve core and the telescopic oil outlet.

21. The data centre cabinet according to claim 1, wherein the each server housings comprises an upper cover and a box; the upper cover is fixed on the box; the upper cover comprises a coolant intake pipe, at least one spray pressure chamber, at least one spray hole and an upper cover shell, and the box comprises a box shell and a coolant outlet pipe; an inner surface of the upper cover shell is provided with the at least one spray pressure chamber, the coolant intake pipe is connected to the at least one spray pressure chamber, and the spray pressure chamber is provided with the at least one spray hole; and the at least one spray hole is directly opposite to a heating chip area of the server.

22. The data centre cabinet according to claim 21, wherein the box is internally provided with a flow channel, and the coolant outlet pipe is in communication with the flow channel; the each server housing further comprises a seal, and the upper cover is hermetically installed with the box through the seal; an inner surface of the box shell is further provided with a partition; and the flow channel and the heating chip area of the server are located on a same side of the partition.

23. The data centre cabinet according to claim 22, wherein the data centre cabinet further comprises an oil intake switch valve; the oil intake switch valve is installed at a joint between the each server housing and the oil intake device and a joint between the each liquid distributor and the oil intake device; the oil intake switch valve comprises a switch valve oil inlet, a valve core, a valve body, a switch and a telescopic oil outlet; the switch valve oil inlet is connected to the oil intake device; and the switch controls the valve core and the telescopic oil outlet.

24. The data centre cabinet according to claim 21, wherein the data centre cabinet further comprises an oil intake switch valve; the oil intake switch valve is installed at a joint between the each server housing and the oil intake device and a joint between the each liquid distributor and the oil intake device; the oil intake switch valve comprises a switch valve oil inlet, a valve core, a valve body, a switch and a telescopic oil outlet; the switch valve oil inlet is connected to the oil intake device; and the switch controls the valve core and the telescopic oil outlet.

25. A gravity spray system, comprising a main oil tank, a pump, a radiator, a data centre cabinet, an oil intake device, an oil return device and a cooling liquid oil, wherein the main oil tank, the pump, the radiator and the data centre cabinet are connected into a closed oil circuit by the oil intake device and the oil return device;
the cooling liquid oil is pumped out of the main oil tank by the pump, after passing through the radiator for a heat exchange, the cooling liquid oil enters an oil distributor in the data centre cabinet through a first pipeline;
the oil distributor is located at an upper part of the data centre cabinet;
the oil distributor distributes the cooling liquid oil, and each liquid distributor of a plurality of liquid distributors distributes and sprays the cooling liquid oil to cool servers in the data centre cabinet; and
the cooling liquid oil after a cooling treatment returns to the main oil tank through the oil return device;
the data centre cabinet comprises a cabinet body;
the oil distributor; and
the plurality of liquid distributors;
the cabinet body comprises a plurality of mounting racks;
the cabinet body is sequentially mounted with a plurality of server housings from top to bottom;
each server of the servers is placed in each server housing of the plurality of server housings;
one of the plurality of liquid distributors is provided above each server housing;
each liquid distributor of the plurality of liquid distributors is provided with the each server housing;
the oil distributor is mounted above the plurality of liquid distributors;
the oil distributor is connected to the each liquid distributor via the oil intake device; and
the cooling liquid oil is distributed and flows to the each liquid distributor through the oil distributor, and the plurality of liquid distributors spray the cooling liquid oil to the servers for cooling;
the oil distributor comprises a case, at least one oil distribution inlet end and a plurality of oil distribution units;
the plurality of oil distribution units are mounted in the case;
each oil distribution unit of the plurality of oil distribution units comprises an oil distribution outlet end and an oil quantity regulator, the oil quantity regulator is directly opposite to the oil distribution outlet end, and the oil quantity regulator controls a quantity of the cooling liquid oil discharged at the oil distribution outlet end; and
the cooling liquid oil enters the oil distributor from the at least one oil distribution inlet end, and the oil distributor is connected to the each liquid distributor via the oil distribution outlet end.

26. The gravity spray system according to claim 25, wherein the each oil distribution units further comprises a vent pipe and a diversion guide plate; the diversion guide plate separates the each oil distribution unit into an independent unit; the vent pipe is in communication with the oil distribution outlet end; the oil quantity regulator comprises a cone, an elastic member and a pressing rod; the pressing rod is fixedly mounted on one side of the case; the cone is fixed at a lower end of the pressing rod; the cone is directly opposite to the oil distribution outlet end; and the elastic member adjusts a distance between the cone and the oil distribution outlet end.

27. The gravity spray system according to claim 26, wherein the oil distributor further comprises an oil intake regulating valve, a bubble removing device, a pressure relief pipe and a respirator; the oil intake regulating valve is connected to the at least one oil distribution inlet end via a second pipeline; the oil intake regulating valve comprises an oil intake valve body, a connecting rod and a floating body; the floating body ascends and drives the connecting rod to move, so as to close the oil intake valve body; the bubble removing device is mounted adjacent to the plurality of oil distribution units; the pressure relief pipe comprises at least one pressure relief oil inlet, at least one pressure relief oil outlet and a plurality of pressure relief holes; the at least one pressure relief oil inlet is connected to the oil intake regulating valve; the plurality of pressure relief holes are located on a pipe wall of the pressure relief pipe; the respirator is mounted on an upper cover of the case; and the respirator is configured for allowing air inside the oil distributor to be in communication with outside air.

28. The gravity spray system according to claim 27, wherein the each liquid distributor comprises an oil return chamber, an oil spray chamber, a liquid distribution oil inlet and an oil return port; the oil return chamber is positioned above the oil spray chamber; the liquid distribution oil inlet is positioned in the oil spray chamber; a lower bottom face of the oil spray chamber is provided with a spray hole; the spray hole is directly opposite to a respective one of the servers below the each liquid distributor; the oil return chamber receives the cooling liquid oil from a respective one of the servers above the each liquid distributor; and the oil return port is configured for discharging the cooling liquid oil in the oil return chamber.

29. The gravity spray system according to claim 28, wherein the each liquid distributor further comprises an overflow hole; the overflow hole is provided on the lower bottom face of the oil spray chamber; the overflow hole is at a position higher than the lower bottom face of the oil spray chamber; and an included angle is provided between the oil return chamber and a horizontal plane.

30. The gravity spray system according to claim 29, wherein the data centre cabinet further comprises an oil intake switch valve; the oil intake switch valve is installed at a joint between the each server housing and the oil intake device and a joint between the each liquid distributor and the oil intake device; the oil intake switch valve comprises a switch valve oil inlet, a valve core, a valve body, a switch and a telescopic oil outlet; the switch valve oil inlet is connected to the oil intake device; and the switch controls the valve core and the telescopic oil outlet.

31. The gravity spray system according to claim 27, wherein the each server housing comprises an upper cover and a box; the upper cover is fixed on the box; the upper cover comprises a coolant intake pipe, at least one spray pressure chamber, at least one spray hole and an upper cover shell, and the box comprises a box shell and a coolant outlet pipe; an inner surface of the upper cover shell is provided with the at least one spray pressure chamber, the coolant intake pipe is connected to the at least one spray pressure chamber, and the spray pressure chamber is provided with the at least one spray hole; and the at least one spray hole is directly opposite to a heating chip area of the server.

32. The gravity spray system according to claim 31, wherein the box is internally provided with a flow channel, and the coolant outlet pipe is in communication with the flow channel; the each server housing further comprises a seal, and the upper cover is hermetically installed with the box through the seal; an inner surface of the box shell is further provided with a partition; and the flow channel and the heating chip area of the server are located on a same side of the partition.

33. The gravity spray system according to claim 32, wherein the data centre cabinet further comprises an oil intake switch valve; the oil intake switch valve is installed at a joint between the each server housing and the oil intake device and a joint between the each liquid distributor and the oil intake device; the oil intake switch valve comprises a switch valve oil inlet, a valve core, a valve body, a switch and a telescopic oil outlet; the switch valve oil inlet is connected to the oil intake device; and the switch controls the valve core and the telescopic oil outlet.

34. The gravity spray system according to claim 31, wherein the data centre cabinet further comprises an oil intake switch valve; the oil intake switch valve is installed at a joint between the each server housing and the oil intake device and a joint between the each liquid distributor and the oil intake device; the oil intake switch valve comprises a switch valve oil inlet, a valve core, a valve body, a switch and a telescopic oil outlet; the switch valve oil inlet is connected to the oil intake device; and the switch controls the valve core and the telescopic oil outlet.

35. The gravity spray system according to claim 26, wherein the each liquid distributor comprises an oil return chamber, an oil spray chamber, a liquid distribution oil inlet and an oil return port; the oil return chamber is positioned above the oil spray chamber; the liquid distribution oil inlet is positioned in the oil spray chamber; a lower bottom face of the oil spray chamber is provided with a spray hole; the spray hole is directly opposite to a respective one of the servers below the each liquid distributor; the oil return chamber receives the cooling liquid oil from a respective one of the servers above the each liquid distributor; and the oil return port is configured for discharging the cooling liquid oil in the oil return chamber.

36. The gravity spray system according to claim 35, wherein the each liquid distributor further comprises an overflow hole; the overflow hole is provided on the lower bottom face of the oil spray chamber; the overflow hole is at a position higher than the lower bottom face of the oil spray chamber; and an included angle is provided between the oil return chamber and a horizontal plane.

37. The gravity spray system according to claim 36, wherein the data centre cabinet further comprises an oil intake switch valve; the oil intake switch valve is installed at a joint between the each server housing and the oil intake device and a joint between the each liquid distributor and the oil intake device; the oil intake switch valve comprises a switch valve oil inlet, a valve core, a valve body, a switch and a telescopic oil outlet; the switch valve oil inlet is connected to the oil intake device; and the switch controls the valve core and the telescopic oil outlet.

38. The gravity spray system according to claim 26, wherein the each server housing comprises an upper cover and a box; the upper cover is fixed on the box; the upper cover comprises a coolant intake pipe, at least one spray pressure chamber, at least one spray hole and an upper cover shell, and the box comprises a box shell and a coolant outlet pipe; an inner surface of the upper cover shell is provided with the at least one spray pressure chamber, the coolant intake pipe is connected to the at least one spray pressure chamber, and the spray pressure chamber is provided with the at least one spray hole; and the at least one spray hole is directly opposite to a heating chip area of the server.

39. The gravity spray system according to claim 38, wherein the box is internally provided with a flow channel, and the coolant outlet pipe is in communication with the flow channel; the each server housing further comprises a seal, and the upper cover is hermetically installed with the box through the seal; an inner surface of the box shell is further provided with a partition; and the flow channel and the heating chip area of the server are located on a same side of the partition.

40. The gravity spray system according to claim 39, wherein the data centre cabinet further comprises an oil intake switch valve; the oil intake switch valve is installed at a joint between the each server housing and the oil intake device and a joint between the each liquid distributor and the oil intake device; the oil intake switch valve comprises a switch valve oil inlet, a valve core, a valve body, a switch and a telescopic oil outlet; the switch valve oil inlet is connected to the oil intake device; and the switch controls the valve core and the telescopic oil outlet.

41. The gravity spray system according to claim 38, wherein the data centre cabinet further comprises an oil intake switch valve; the oil intake switch valve is installed at a joint between the each server housing and the oil intake device and a joint between the each liquid distributor and the oil intake device; the oil intake switch valve comprises a switch valve oil inlet, a valve core, a valve body, a switch and a telescopic oil outlet; the switch valve oil inlet is connected to the oil intake device; and the switch controls the valve core and the telescopic oil outlet.

42. The gravity spray system according to claim 25, wherein the each liquid distributor comprises an oil return chamber, an oil spray chamber, a liquid distribution oil inlet and an oil return port; the oil return chamber is positioned above the oil spray chamber; the liquid distribution oil inlet is positioned in the oil spray chamber; a lower bottom face of the oil spray chamber is provided with a spray hole; the spray hole is directly opposite to a respective one of the servers below the each liquid distributor; the oil return chamber receives the cooling liquid oil from a respective one of the servers above the each liquid distributor; and the oil return port is configured for discharging the cooling liquid oil in the oil return chamber.

43. The gravity spray system according to claim 42, wherein the each liquid distributor further comprises an overflow hole; the overflow hole is provided on the lower bottom face of the oil spray chamber; the overflow hole is at a position higher than the lower bottom face of the oil spray chamber; and an included angle is provided between the oil return chamber and a horizontal plane.

44. The gravity spray system according to claim 43, wherein the data centre cabinet further comprises an oil intake switch valve; the oil intake switch valve is installed at a joint between the each server housing and the oil intake device and a joint between the each liquid distributor and the oil intake device; the oil intake switch valve comprises a switch valve oil inlet, a valve core, a valve body, a switch and a telescopic oil outlet; the switch valve oil inlet is connected to the oil intake device; and the switch controls the valve core and the telescopic oil outlet.

45. The gravity spray system according to claim 25, wherein the each server housing comprises an upper cover and a box; the upper cover is fixed on the box; the upper cover comprises a coolant intake pipe, at least one spray pressure chamber, at least one spray hole and an upper cover shell, and the box comprises a box shell and a coolant outlet pipe; an inner surface of the upper cover shell is provided with the at least one spray pressure chamber, the coolant intake pipe is connected to the at least one spray pressure chamber, and the spray pressure chamber is provided with the at least one spray hole; and the at least one spray hole is directly opposite to a heating chip area of the server.

46. The gravity spray system according to claim 45, wherein the box is internally provided with a flow channel, and the coolant outlet pipe is in communication with the flow channel; the each server housing further comprises a seal, and the upper cover is hermetically installed with the box through the seal; an inner surface of the box shell is further provided with a partition; and the flow channel and the heating chip area of the server are located on a same side of the partition.

47. The gravity spray system according to claim 46, wherein the data centre cabinet further comprises an oil intake switch valve; the oil intake switch valve is installed at a joint between the each server housing and the oil intake device and a joint between the each liquid distributor and the oil intake device; the oil intake switch valve comprises a switch valve oil inlet, a valve core, a valve body, a switch and a telescopic oil outlet; the switch valve oil inlet is connected to the oil intake device; and the switch controls the valve core and the telescopic oil outlet.

48. The gravity spray system according to claim 45, wherein the data centre cabinet further comprises an oil intake switch valve; the oil intake switch valve is installed at a joint between the each server housing and the oil intake device and a joint between the each liquid distributor and the oil intake device; the oil intake switch valve comprises a switch valve oil inlet, a valve core, a valve body, a switch and a telescopic oil outlet; the switch valve oil inlet is connected to the oil intake device; and the switch controls the valve core and the telescopic oil outlet.

49. The gravity spray system according to claim 25, wherein the gravity spray system further comprises a filter and an auxiliary oil tank; the filter is connected in the closed oil circuit; the oil intake device comprises an oil intake pipeline, an oil intake tank and an oil intake branch pipe; an upper end of the oil intake tank is connected to the oil distributor, and a lower end of the oil intake tank is connected to the auxiliary oil tank; one side of the oil intake tank is connected to a first end of the oil intake branch pipe; a second end of the oil intake branch pipe is connected to the plurality of server housings or the plurality of liquid distributors; an oil intake regulating valve is further provided at a joint between the oil intake tank and the oil intake branch pipe; the oil return device comprises an oil return tank and an oil return pipeline; the auxiliary oil tank is connected to the main oil tank via the oil return pipeline; and an oil return port of the each liquid distributor is in communication with the oil return tank.

50. The gravity spray system according to claim 49, wherein the cooling liquid oil is an insulating liquid oil, the insulating liquid oil is at least one selected from a group consisting of a natural mineral oil, a silicone oil, a plant oil, a transformer oil and a heat transfer oil; the each server housing is internally provided with the cooling liquid oil; and the cooling liquid oil occupies 0%-50% of a space of the each server housing.

51. The gravity spray system according to claim 25, wherein the cooling liquid oil is an insulating liquid oil, the insulating liquid oil is at least one selected from a group consisting of a natural mineral oil, a silicone oil, a plant oil, a transformer oil and a heat transfer oil; the each server housing is internally provided with the cooling liquid oil; and the cooling liquid oil occupies 0%-50% of a space of the each server housing.

* * * * *